United States Patent [19]

Kagawa et al.

[11] Patent Number: 4,906,583
[45] Date of Patent: Mar. 6, 1990

[54] MAKING A SEMICONDUCTOR PHOTODETECTOR

[75] Inventors: Shuzo Kagawa, Atsugi; Junji Komeno, Fujisawa, both of Japan

[73] Assignee: Fujitsu Limited, Kawasaki, Japan

[21] Appl. No.: 235,789

[22] Filed: Aug. 22, 1988

Related U.S. Application Data

[63] Continuation of Ser. No. 810,142, Dec. 18, 1985, abandoned.

[30] Foreign Application Priority Data

Dec. 22, 1984 [JP] Japan .................. 59-269652

[51] Int. Cl.$^4$ ............................. H01L 31/18
[52] U.S. Cl. .................. 437/5; 148/DIG. 15;
148/DIG. 72; 148/DIG. 97; 148/DIG. 120;
156/610; 357/30; 437/81; 437/121; 437/130;
437/133; 437/916; 437/976
[58] Field of Search .............. 148/DIG. 5, 15, 57,
148/65, 66, 67, 72, 97, 110, 120, 169;
156/610–615; 357/13, 16, 29, 30; 437/3, 2, 5,
81, 119, 121, 126, 130, 133, 904, 916, 976

[56] References Cited

U.S. PATENT DOCUMENTS

| | | | |
|---|---|---|---|
| 4,442,444 | 4/1984 | Osaka | 357/30 A |
| 4,477,964 | 10/1984 | Chin et al. | 437/156 |
| 4,481,523 | 11/1984 | Osaka et al. | 357/16 |
| 4,502,898 | 3/1985 | Camlibel | 437/160 |
| 4,507,169 | 3/1985 | Nogami | 437/133 |
| 4,608,586 | 8/1986 | Kim | 357/16 |
| 4,651,187 | 3/1987 | Sugimoto et al. | 357/30 A |
| 4,700,209 | 10/1987 | Webb | 357/16 |

FOREIGN PATENT DOCUMENTS

| | | | |
|---|---|---|---|
| 0109855 | 5/1984 | European Pat. Off. | 357/30 A |
| 57-112084 | 7/1982 | Japan | 357/30 A |
| 2030767 | 4/1980 | United Kingdom | |

OTHER PUBLICATIONS

IEEE Transactions on Electron Devices, vol. ED-30, No. 4, Apr. 1983, pp. 395–400, New York, US; P. P. Webb et al: "Large-Area and Visible Response VPE InGaAs Photodiodes".

Patent Abstracts of Japan, vol. 5, No. 99 (E-63) [771], 26th Jun. 1981; & JP-A-56 43781.

Electronics Letters, vol. 19, No. 20, 29th Sep. 1983, pp. 845–846, London, GB; Y. Matsushima et al.: "Receiver Sensitivity of InGaAs/InP Heterostructure Avalanche Photodiode with InGaAsP Buffer Layers at 1.5–1.6 Micrometer Region".

Extended Abstracts of the Electrochemical Society, vol. 83–1, May 1983, pp. 523–524, Pennington, N.J., US; C. B. Morrison et al.: "$In_xGA_{1-x}AS$ Photodetector for the 1.7 to 2.0 Micron Spectral Region".

J. Komeno et al, TDEG IN InGaAs-InP Heterojunction Grown by Chloride VPE, Electronics Letters, 23rd Jun. 1983, vol. 19, No. 13, pp. 473–474.

N. Nakajima et al, LPE Growth of Misfit Dislocation—Free Thick InGaAs Layers on InP, J. Electrochem. So., vol. 127, No. 7, Jul. 1980, pp. 1568–1572.

Primary Examiner—Brian E. Hearn
Assistant Examiner—William Bunch
Attorney, Agent, or Firm—Armstrong, Nikaido, Marmelstein, Kubovcik & Murray

[57] ABSTRACT

A semiconductor photodetector, such as a PIN photodiode and an avalanche photodiode, comprising an InP substrate, a first InP layer, a GaInAs or GaInAsP light absorbing layer, and a second InP layer. All of the layers are successively grown by a vapor phase epitaxial process wherein the lattice constant of the GaInAs (GaInAsP) layer is larger than that of the InP layer at room temperature. The photodetector has a low dark current.

9 Claims, 3 Drawing Sheets

MAKING A SEMICONDUCTOR PHOTODETECTOR

This application is a continuation of application Ser. No. 810,142 filed Dec. 18, 1095 now abandoned.

BACKGROUND OF THE INVENTION

1. Field of the Invention

The present invention relates to semiconductor photodetectors, such as a PIN photodiode and an avalanche photodiode. More particularly, it relates to an improvement of such photodetectors made of a III-V alloy system, such as GaInAs/InP, and GaInAsP/InP.

2. Description of the Related Art

Photodetectors for optical fiber communication systems in the 1.3 to 1.6 μm wavelength region include PIN photodiodes and avalanche photodiodes made of a III-V alloy system, e.g., GaInAs/InP system. Such a photodiode comprises an InP substrate, an InP buffer layer, an GaInAs light absorbing layer, and an InP cap layer, these layers being epitaxially formed in succession on the InP substrate. Heterojunctions are formed at interfaces between the InP buffer layer and GaInAs layer, and between the GaInAs layer and InP cap layer.

A PIN photodiode is produced, for example, in the following manner. First, an undoped (N$^-$-type) InP buffer layer is epitaxially grown on a (100) oriented N$^+$-type InP substrate; an undoped (N$^-$-type) GaInAs light absorbing layer is epitaxially grown on the InP buffer layer; and an N-type InP cap layer is also epitaxially grown on the GaInAs layer. A P-type region is formed as a light receiving area in the InP cap layer by a thermal diffusion process; an antireflecting film is formed on the P-type region; and a protecting film is formed on the InP cap layer. Finally, a P-side electrode and an N-side electrode are formed on the P$^+$-type region and the InP substrate, respectively. During the epitaxial growth, the growing conditions are controlled so that the lattice constant of the grown layers matches that of the InP substrate; to decrease the possibility of lattice mismatching. It is easy to match the lattice constant of InP layer to that of the InP substrate, since the InP layer and the InP substrate can have the same composition, but when the GaInAs layer is epitaxially grown on the InP layer, i.e., InP substrate, it, is necessary to control the composition ratio of Ga to In in the GaInAs layer so that the lattice constant of the GaInAs matches that of the InP. The thermal expansion coefficient of GaInAs is 1.24 times larger than that of InP; i.e., the thermal expansion coefficient of InP is $4.56 \times 10^{-6}$ K$^{-1}$ and that of GaInAs is $5.66 \times 10^{-6}$ K$^{-1}$. Therefore, when the GaInAs layer is grown at a temperature of, typically, from 600° C. to 700° C. to obtain a lattice match with the InP layer, the shrinkage of the GaInAs layer is more than that of the InP layer, at a room temperature, with the result that strain is generated, which causes mismatching between the layers. In another method, it is possible to grow the GaInAs layer in a mismatching condition so that the GaInAs and InP will match when cooled at room temperature.

In accordance with the above-mentioned two growing methods two GaInAs light absorbing layers are each epitaxially grown in liquid-phase condition on the InP buffer layer, and each of the obtained GaInAs layers is measured by an X-ray diffractometry, respectively. As a result, it was found that it is preferable to match GaInAs to InP at an epitaxial growing temperature, e.g., 600° C. to 700° C., as in the former method above, since this growing method generates less mismatching than the latter growing method above. Therefore, a Ga$_{0.48}$In$_{0.52}$As layer is liquid-phase grown on the InP layer at a usual growing temperature, e.g., 650° C. under the lattice matching condition. In this case, at a room temperature, the lattice constant of GaInAs is smaller than that of InP, due to the thermal expansion difference, by a lattice mismatching degree $\Delta a/a$ of approximately $-0.07\%$: wherein $$\frac{\Delta a}{a} = \frac{GaInAs \text{ lattice constant} - InP \text{ lattice constant}}{InP \text{ lattice constant}}$$

According to the above experience of the liquid-phase epitaxial growth it has been believed that, even in the vapor-phase epitaxial growth, the GaInAs layer growth under the lattice matching condition brings about the least mismatching at the heterointerface between the GaInAs and InP layers, notwithstanding the lattice mismatching degree ($\Delta a/a$) of $-0.07\%$ at a room temperature. Such a belief may be based on the fact that both the vapor-phase epitaxial growth and the liquid-phase epitaxial growth are epitaxial growths. However, although PIN photodiodes are produced at the same time by performing the vapor-phase epitaxial growth of the GaInAs layer under the above-mentioned preferable condition, the properties of the produced PIN photodiodes are not satisfactory, in particular, the problem of dark current in the photodiodes occurs frequently.

SUMMARY OF THE INVENTION

An object of the present invention is to provide a photodetector, such as a PIN photodiode and an avalanche photodiode, having a GaInAs/InP or GaInAsP/InP system, with a low dark current.

The present invention is based on the finding of the inventors that at the lattice mismatching degree $\Delta a/a$ between the GaInAs (or GaInAsP) light absorbing layer and the InP buffer layer in the positive (plus) range (especially, from 0 to 0.2%) the dark current is lower than the negative (minus) range (outside the range of 0 to 0.2%) at room temperature. The GaInAs (or GaInAsP) light absorbing layer having an energy bandgap smaller than the InP layer, being a dark current generating region, is under a tension stress at minus $\Delta a/a$, but is under a compression stress at plus $\Delta a/a$. Here the present inventors have assumed that the crystal state of the GaInAs (or GaInAsP) layer under a compression stress is more stable than that under a tension stress.

According to the present invention, in a semiconductor photodetector comprising an InP substrate, a first InP layer, a GaInAs (or GaInAsP) layer, and a second InP layer, wherein the layers are successively epitaxially formed on the InP substrate, the lattice constance of the GaInAs (or GaInAsP) layer is larger than that of the first InP layer at room temperature. All of the layers are sequentially grown by a vapor phase epitaxial process.

BRIEF DESCRIPTION OF THE DRAWINGS

The present invention will be clear from the description of the preferred embodiments set forth below with reference to the accompanying drawings, in which.

DESCRIPTION OF THE PREFERRED EMBODIMENTS

Figure 1:
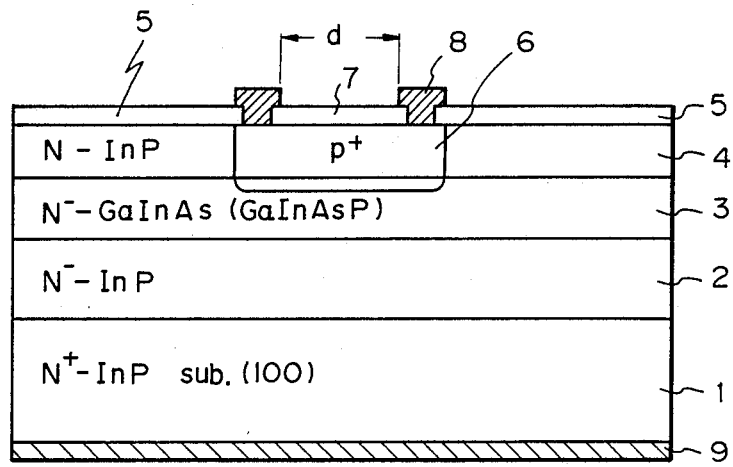
FIG. 1 is a sectional view of a PIN photodiode having a GaInAs/InP system.

Referring to FIG. 1, a PIN photodiode comprises, for example, an N+-type InP substrate 1, an undoped N−-type InP buffer layer 2, an undoped N−-type GaInAs (or GaInAsP) light absorbing layer 3, an N-type InP cap layer 4, and a passivation film 5. A P+-type region 6 is formed in the InP cap layer 4 and extends into the GaInAs (or GaInAsP) layer 3. An antireflecting film 7 is formed on the P+-type region 6, a P-side electrode 8 is formed on a portion of the P+-type region 6, and an N-side electrode 9 is formed on the InP substrate 1. The above structure is that of a PIN photodiode.

The PIN photodiode illustrated in FIG. 1 is produced, for example, as follows.

First, a (100) oriented N+-type InP wafer having an impurity concentration of approximately $4 \times$ cm$^{-3}$ is prepared as the substrate 1. On the InP substrate 1 the InP buffer layer 2 having a thickness of 3 μm and an impurity concentration of approximately $5 \times 10^{14}$ cm$^{-3}$ is grown by a vapor phase epitaxial process, under the following conditions. A carrier gas of H$_2$ is made to flow through PCl$_3$ liquid to feed an H$_2$+PCl$_3$ gas at a flow rate of 300 cm$^3$/min into a reactor. In the reactor, an In source and the InP substrate 1 are heated at 800° C. and 670° C., respectively. An additional carrier gas of H$_2$ is fed into the reactor, so that the total H$_2$ flow rate at the growth region is 956 cm$^3$/min. As a result, the InP layer 2 is grown at a growth rate of approximately 12 Å/sec.

Then the GaInAs layer 3 having a thickness of 1.6 μm and an impurity concentration of approximately $1 \times 10^{15}$ cm$^{-3}$ is grown on the InP layer 2 by vapor phase epitaxy under the following conditions. A carrier gas of H$_2$ is made to flow through AsCl$_3$ liquid to feed an H$_2$+AsCl$_3$ gas into the reactor. A portion of the H$_2$+AsCl$_3$ gas is made to flow at a flow rate of 144 cm$^3$/min over a Ga source heated at 750° C. and the rest of the H$_2$+AsCl$_3$ gas to flow at a flow rate of 312 cm$^3$/min over another In source heated at 800° C. An additional carrier gas of H$_2$ is fed into the reactor, so that the total H$_2$ flow rate at the growth region in which the substrate 1 is heated at 670° C. is 956 cm$^3$/min As a result, the Ga$_{0.45}$In$_{0.55}$As layer 3 is grown at a growth rate of approximately 3 Å/sec. In this kind of GaInAs epitaxy growth process, an atomic ratio "x" of In to Ga in Ga$_{1-x}$In$_x$As can be varied by controlling a ratio of the flow rate of the H$_2$+AsCl$_3$ gas over the In source to that of the H$_2$+AsCl$_3$ gas over the Ga source. Therefore, the lattice constants of the GaInAs layer can be varied, so that a lattice mismatching degree Δa/a also can be varied.

To grow a quaternary compound layer of GaInAsP instead of flowing H$_2$+AsCl$_3$ gas over either the Ga source or the In source is replaced with a flow of H$_2$+PCl$_3$ gas.

Thereafter the InP cap layer 4 having a thickness of 1 μm and an impurity concentration of approximately $1 \times 10^{16}$ cm$^{-3}$ is grown in the similar manner to that of the InP buffer layer 2, except that donor impurities (sulfur) are doped.

The passivation film 5 of silicon nitride and having a thickness of approximately 0.18 μm is formed on the InP cap layer 4 by a plasma chemical vapor deposition (CVD). The silicon nitride film 5 is then selectively etched by conventional photo-lithography to form an opening for a photodetective region. The P+-type region 6 is formed by thermally diffusing zinc (Zn) into the InP cap layer 4 through the opening of the silicon nitride film 5 at 500° C. The diffused Zn reaches a portion of the GaInAs layer 3, so that the bottom of the P+-type region 7 is in the GaInAs layer 3, as shown in FIG. 1. The surface impurity concentration of the P+-type region 7 is approximately $4 \times 10^{18}$ cm$^{-3}$.

Then the antireflection film 7 of silicon nitride having a thickness of 1.8 μm is formed on the exposed surface of the P+-type region 6 by plasma CVD. In this case, silicon nitride is also deposited on the formed silicon nitride film 5, so that the thickness of the passivation film 5 of silicon nitride is increased.

The antireflection film 7 is selectively etched by conventional photo-lithography to form an opening for the electrode 8. The electrode 8 of AuZn is formed by a conventional process, so that it comes into contact with the P+-type region 6. The diameter d of a photodetective region is 80 μm. The electrode 9 of AuGe is formed on the InP substrate 1 by a conventional process. Thus, the PIN photodiode is obtained.

Figure 2:
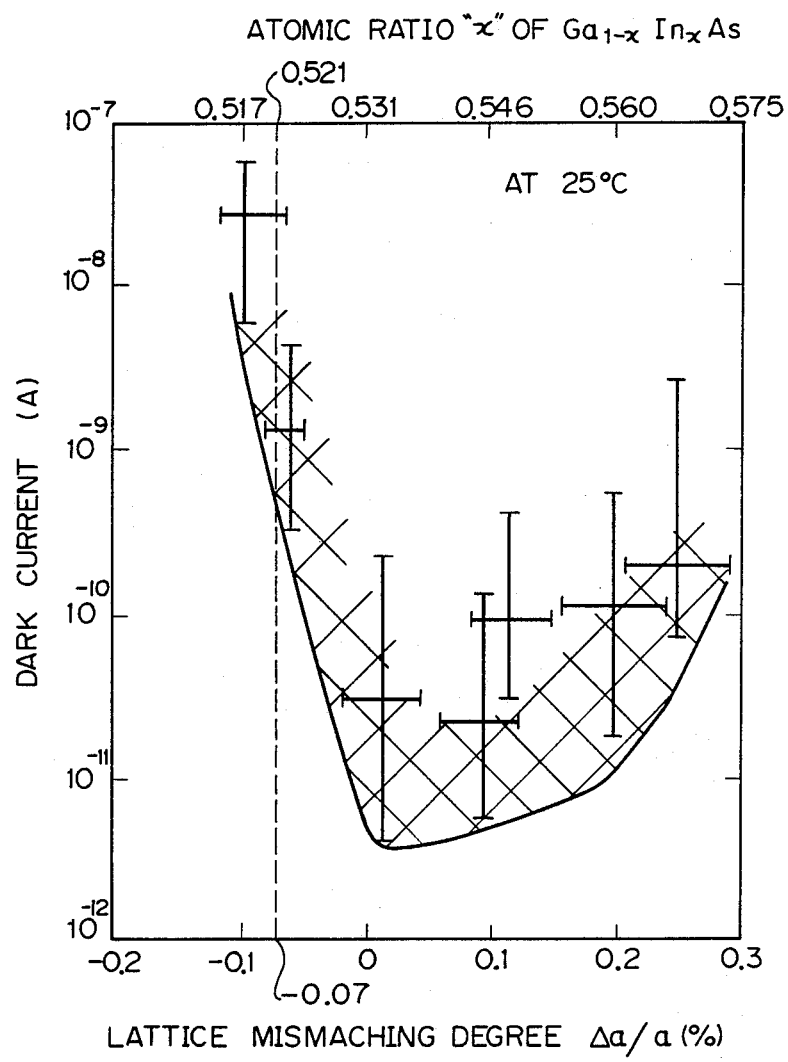
FIG. 2 is a graph showing the relationship between a lattice mismatching degree (Δa/a) and a dark current in PIN photodiodes in a GaInAs/InP system.
Figure 3:
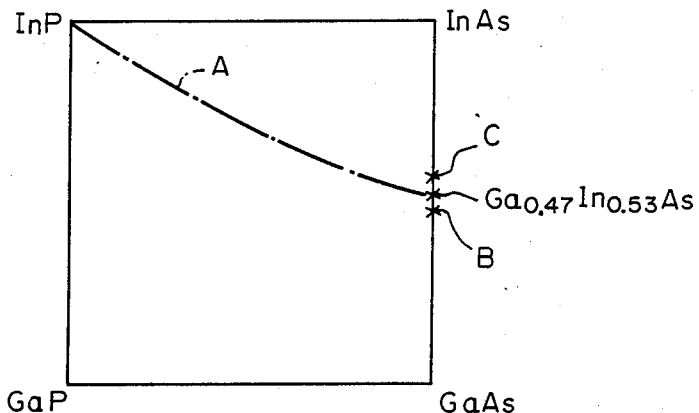
FIG. 3 is a graph showing a lattice matching condition for InP in a GaInAsP system.

A large number of PIN photodiodes produced in the above-mentioned manner were examined for the amount of dark current therein and the lattice mismatching degree Δa/a between the GaInAs layer and the InP layer at room temperature. The lattice mismatching degree was measured by the X-ray diffraction method. The obtained results of the amount of dark current and lattice mismatching degree Δa/a are shown in FIG. 2. Each cross indicates the range of Δa/a and dark current of PIN photodiodes produced in an InP wafer. As seen in FIG. 2, low dark current photodiodes are obtained on the plus side of Δa/a, preferably from 0 to +0.2%. A broken line in FIG. 2 indicates a lattice mismatching degree Δa/a (−0.07%) obtained when a Ga$_{0.48}$In$_{0.52}$As layer is liquid phase epitaxially grown under the lattice matching condition at the growing temperature. According to the present invention, the GaInAs layer is vapor phase epitaxially grown under the condition that the lattice constant of the grown GaInAs layer is larger than that of the InP layer at the growing temperature. Namely, as shown in FIG. 3, a lattice matching condition for InP in a GaLnAsP quaternary system is indicated with a dot and dash line A, including Ga$_{0.47}$In$_{0.53}$As in a GaInAs ternary system. In a conventional case, A GaInAs having whereas in the present invention a GaInAs having a a composition at a point C is grown due to Δa/a<0, whereas in the present invention a GaInAs having a composition at a point C is grown under the limitation of 0<Δa/a<0.2.

Figure 4:
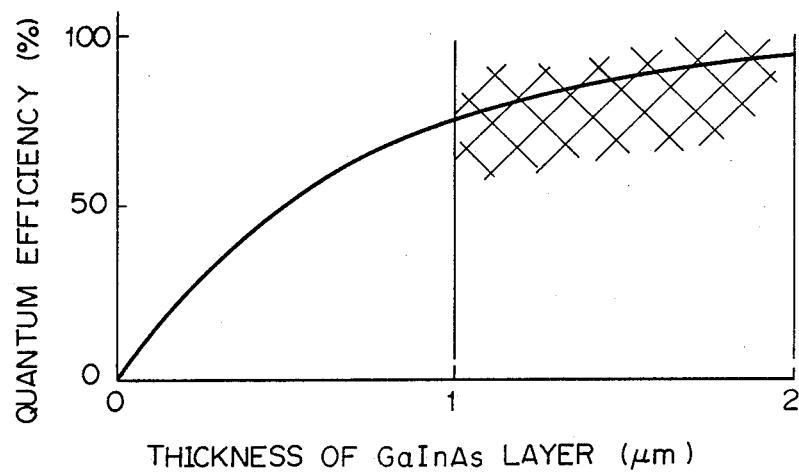
FIG. 4 is a graph showing the relationship between a thickness of GaInAs layer and a quantum efficiency.

As to the thickness of the GaInAs layer, a thicker GaInAs layer having +Δa/a applies a stronger force on the heterojunction interface. Accordingly, it is preferable that the GaInAs layer be thin. However, too thin a GaInAs layer brings about a decrease of the quantum efficiency of the layer. FIG. 4 shows a relationship between the GaInAs layer thickness and the quantum efficiency; the abscissa showing the thickness of a GaInAs layer and the ordinate showing the corresponding quantum efficiency. The quantum efficiency $\eta$ at 1.3 $\mu$m is calculated by the following formula:

$$\eta = 1 - e^{-\alpha x}$$

wherein $\alpha$ is an optical absorption coefficient ($1.4 \times 10^4$ cm$^{-1}$ of GaInAs), and x is a depth of the GaInAs layer. As seen from FIG. 4, when the GaInAs layer thickness is less than 1 $\mu$m, the quantum efficiency further decreases. Therefore, to attain a required quantum efficiency of a photodiode and the application of a low force on the heterojunction interface, the GaInAs layer preferably has a thickness of from 1 to 2 $\mu$m. Furthermore, a force applied on the heterojunction interface between the GaInAs layer and the InP cap layer is preferably decreased by making the InP cap layer thinner. In practice, the InP cap layer preferably has a thickness of from 1.0 to 0.3 $\mu$m.

Figure 5:
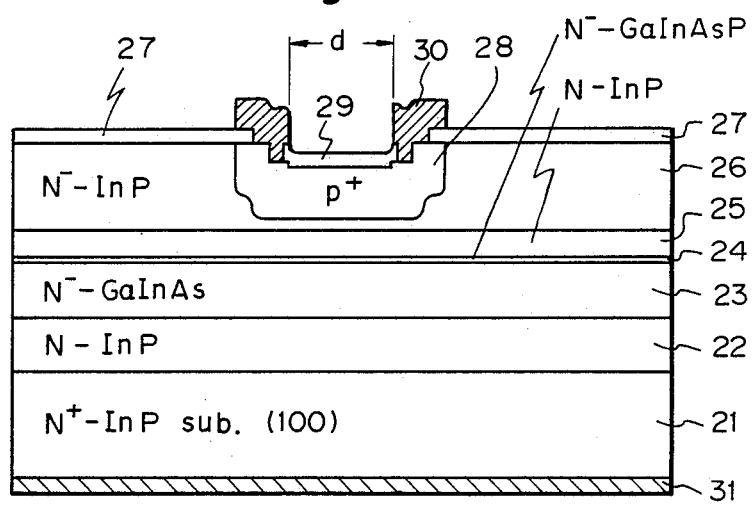
FIG. 5 is a sectional view of an avalanche photodiode having a GaInAs/GaInAsP/InP system.

Referring to FIG. 5, an avalanche photodiode comprises, for example, a (100) N$^+$-type InP substrate 21, an N-type InP layer 22, an undoped N$^-$-type GaInAs light absorbing layer 23, an undoped N$^-$-type GaInAsP thin layer 24, an N-type InP layer 25, and an N$^-$-type InP layer 26. A passivation film 27 is formed on the N$^-$-type InP layer 26, a P$^+$-type region 28 is formed in the N$^-$-type InP layer 26, and an antireflection film 29 is formed on the P$^+$-type region 28. A P-side electrode 30 and an N-side electrode 31 are formed on a portion of the P$^+$-type region 28 and on the InP substrate 21, respectively.

According to the present invention, the lattice constant of the GaInAs layer 23 is larger than that of the InP layer 22 at room temperature. Preferably, the lattice constant of the GaInAsP layer lies in the range between the InP lattice constant and the GaInAs layer lattice constant, inclusively, at room temperature. It is also preferable that another undoped N$^-$-type GaInAsP thin layer (not shown) be formed between the N-type InP layer 22 and the GaInAsP layer 23. The GaInAsP layer has an energy bandgap Eg having an intermediate value (0.9 eV) between that of InP (1.35 eV) and GaInAs (0.75 eV). The GaInAsP layer has the intermediate energy bandgap and lattice constant values, and thus can improve the frequency property of an avalanche photodiode.

The avalanche photodiode illustrated in FIG. 5 is produced, for example, in the following manner.

A (100) oriented N$^+$-type InP wafer having an impurity concentration of approximately $4 \times 10^{18}$ cm$^{-3}$ is prepared as the substrate 21.

On the InP substrate, the layers 22 to 26 having the thicknesses and impurity concentrations shown in Table 1 are successively grown by a vapor phase epitaxial process mentioned hereinbefore.

TABLE 1

| Layer | Thickness ($\mu$m) | Impurity concentration (cm$^{-3}$) |
|---|---|---|
| N—InP 22 | 2 | $2 \times 10^{16}$ |
| N$^-$—GaInAs 23 | 1.6 | $2 \times 10^{15}$ |
| N$^-$—GaInAsP 24 | 0.1 | $2 \times 10^{15}$ |
| N—InP 25 | 1 | $2 \times 10^{16}$ |
| N$^-$—InP 26 | 5 | $4 \times 10^{15}$ |

In the formation of the N$^-$-type GaInAs layer 23, the growing conditions are controlled so as to make the lattice constant of GaInAs larger than that of InP at room temperature. Similarly, the growing conditions for the GaInAsP layer 24 are controlled so as to make the lattice constant of GaInAsP not less than that of InP and not more than that of the formed GaInAs layer at room temperature.

The passivation film 27 of silicon nitride with an opening is formed by a plasma CVD process and by conventional photo-lithography. Using the passivation film 27 as a mask, Zn is introduced into the N$^-$-type InP layer 26 by a thermal diffusion process to form the P$^+$-type region 28 having a surface impurity concentration of $4 \times 10^{18}$ cm$^{-3}$.

Then the antireflection film 29 of silicon nitride having a thickness of 0.18 $\mu$m is formed on the P$^+$-type region 28 by the plasma CVD process. The electrode 30 of AuZn and the electrode 31 of AuGe are formed on the P$^+$-type region 28 and the InP substrate 21, respectively, as shown in FIG. 5. A light receiving area has a diameter d of 80 $\mu$m. Thus a low dark current avalanche photodiode is obtained.

We claim:

1. A method of forming a semiconductor photodiode comprising the steps of:
   preparing a InP substrate;
   growing a InP buffer layer on said InP substrate by a vapor phase epitaxial process using a gas including P and In;
   growing a Ga$_{1-x}$In$_x$As light absorbing layer on said InP buffer layer by a vapor phase epitaxial process while controlling the flow rates of As gas, Ga gas and In gas such that the lattice mismatching degree ($\Delta a/a$) between said Ga$_{1-x}$In$_x$As light absorbing layer and said InP buffer layer is more than 0% and less than 0.2% at room temperature, as defined by the equation:

$$\frac{\Delta a}{a} = \frac{\text{GaInAs lattice constant} - \text{InP lattice constant}}{\text{InP lattice constant}};$$

gorwing a cap layer on said Ga$_{1-x}$In$_x$As layer; and
   introducing impurity ions into said cap layer so as to make a Pn junctions.

2. A method according to claim 1 wherein, said "x" is between 0.531 and 0.560.

3. A method according to claim 1 wherein, said Ga$_{1-x}$In$_x$As light absorbing layer has a thickness of between 1 $\mu$m to 20 $\mu$m.

4. A method according to claim 1 wherein, in said step of growing the Ga$_{1-x}$In$_x$As light absorbing layer, As included gas is fed into a reactor in which a Ga source, In source and the InP substrate are provided, and said As included gas flows over said Ga source and In source respectively.

5. A method of forming a semiconductor photodiode comprising the steps of;
   preparing a InP substrate;
   growing a InP buffer layer on said InP substrate by a vapor phase epitaxial process using a gas including P and In;
   growing a Ga$_{1-x}$In$_x$As$_{1-y}$P$_y$ light a absorbing layer on said InP buffer layer by a vapor phase epitaxial process while controlling the flow rates of As gas, Ga gas, In gas, and P gas such that the lattice mismatching degree ($\Delta a/a$) between said Ga$_{1-x}$In$_x$As$_{1-y}$P$_y$ light absorbing layer and said InP buffer layer is more than 0% and less than 0.2% at room temperature, as defined by the equation:

$$\frac{\Delta a}{a} = \frac{\text{GaInAsP lattice constant} - \text{InP lattice constant}}{\text{InP lattice constant}};$$

growing a cap layer on said $Ga_{1-x}In_xAs_{1-y}P_y$ light absorbing layer; and introducing impurity ions into said cap layer so as to form a PN junction.

6. A method according to claim 5 wherein, said $Ga_{1-x}In_xAs_{1-y}P_y$ light absorbing layer has a thickness of between 1 μm to 2 μm.

7. A method according to claim 5 wherein, in said step of growing the $Ga_{1-x}In_xAs_{1-y}P_y$ light absorbing layer, a gas containing As and a gas containing P are fed into a reactor in which a Ga source, In source and the InP substrate are provided, said gas containing As flowing over one of said Ga source and In source, and said gas containing P flowing over the other of said Ga source and In source.

8. A method according to claim 1, further comprising a step of growing $Ga_{1-x}In_xAs$ light absorbing layer and said cap layer, said cap layer being InP.

9. A method according to claim 1, wherein x and y are defined as being above line A of FIG. 3.

* * * * *